(12) United States Patent
Kariya et al.

(10) Patent No.: US 7,495,332 B2
(45) Date of Patent: Feb. 24, 2009

(54) MULTILAYER PRINTED WIRING BOARD

(75) Inventors: Takashi Kariya, Ibi-gun (JP); Toshiki Furutani, Ibi-gun (JP); Hirofumi Goto, Tokyo (JP); Shin-ichiro Iwanaga, Tokyo (JP)

(73) Assignees: Ibiden Co., Ltd., Ogaki-shi (JP); JSR Corporation, Tokyo (JP)

( * ) Notice: Subject to any disclaimer, the term of this patent is extended or adjusted under 35 U.S.C. 154(b) by 1 day.

(21) Appl. No.: 11/563,355

(22) Filed: Nov. 27, 2006

(65) Prior Publication Data

US 2007/0085203 A1   Apr. 19, 2007

Related U.S. Application Data

(63) Continuation of application No. PCT/JP2005/010099, filed on May 26, 2005.

(30) Foreign Application Priority Data

May 27, 2004   (JP)   .............................. 2004-157459

(51) Int. Cl.
  *H01L 23/14*   (2006.01)
  *H01L 23/28*   (2006.01)
(52) U.S. Cl. ........................ 257/702; 257/758; 257/774; 257/787; 257/E23.062
(58) Field of Classification Search ................. 257/701, 257/702, 758, 774, E23.062, 787
  See application file for complete search history.

(56) References Cited

U.S. PATENT DOCUMENTS

| | | | |
|---|---|---|---|
| 6,770,965 B2 * | 8/2004 | Takeuchi et al. ............ | 257/700 |
| 6,909,054 B2 * | 6/2005 | Sakamoto et al. ........... | 174/260 |
| 6,939,738 B2 * | 9/2005 | Nakatani et al. ............ | 438/108 |
| 2002/0076539 A1 * | 6/2002 | Nakamura et al. .......... | 428/209 |
| 2006/0180341 A1 | 8/2006 | Kariya et al. | |
| 2006/0231290 A1 | 10/2006 | Kariya et al. | |

FOREIGN PATENT DOCUMENTS

| | | |
|---|---|---|
| EP | 0 805 614 A | 11/1997 |
| EP | 0 805 614 A1 | 11/1997 |
| JP | 58-28848 A | 2/1983 |

(Continued)

OTHER PUBLICATIONS

U.S. Appl. No. 11/415,117, filed May 2, 2006, Kariya et al.

(Continued)

*Primary Examiner*—Nitin Parekh
(74) *Attorney, Agent, or Firm*—Oblon, Spivak, McClelland, Maier & Neustadt, P.C.

(57) ABSTRACT

A multilayer printed wiring board is equipped with a core board 20, a build-up layer 30 formed on the core board 20 so as to have a conductor pattern 32 on the upper surface thereof, a low-elasticity layer 40 formed on the build-up layer 30, lands 52 that are provided on the upper surface of the low-elasticity layer 40 and connected to an IC chip 70 via solder bumps 66, and conductor posts 50 that penetrate through the low-elasticity layer 40 and electrically connect the lands 52 to the conductor pattern 32. The low-elasticity layer 40 is formed of resin composition containing epoxy resin, phenol resin, cross-linked rubber particles and a hardening catalyst.

9 Claims, 9 Drawing Sheets

FOREIGN PATENT DOCUMENTS

| | | |
|---|---|---|
| JP | 05-37157 A | 2/1993 |
| JP | 11-17346 A | 1/1999 |
| JP | 2001-36253 A | 2/2001 |
| JP | 2001-288336 A | 10/2001 |
| JP | 2001-298272 | 10/2001 |
| KR | 1999-0067668 A | 8/1999 |

OTHER PUBLICATIONS

U.S. Appl. No. 11/563,355, filed Nov. 27, 2006, Kariya et al.

* cited by examiner

Fig. 9

| Example | Shape of conductor post |  |  |  | Variation rate of electrical resistance (%) |  |  |  |  |
|---|---|---|---|---|---|---|---|---|---|
|  | Height (μm) | Minimum diameter (μm) | Maximum diameter (μm) | Aspect ratio | 500th cycle | 750th cycle | 1000th cycle | 1500th cycle |  |
| 1 | 200 | 100 | 100 | 2 | × | × | × | × |  |
| 2 | 200 | 60 | 60 | 3.3 | × | × | × | × |  |
| 3 | 200 | 50 | 50 | 4 | ○ | ○ | ○ | △ |  |
| 4 | 200 | 40 | 40 | 5 | ○ | ○ | ○ | △ |  |
| 5 | 200 | 100 | 120 | 2 | ○ | × | × | × |  |
| 6 | 200 | 60 | 120 | 3.3 | ○ | △ | × | × |  |
| 7 | 200 | 50 | 120 | 4 | ○ | ○ | ○ | ○ |  |
| 8 | 200 | 40 | 120 | 5 | ○ | ○ | ○ | ○ |  |
| 9 | 200 | 40 | 80 | 5 | ○ | ○ | ○ | ○ |  |
| 10 | 200 | 35 | 80 | 5.7 | ○ | ○ | ○ | ○ |  |
| 11 | 200 | 10 | 10 | 20 | × | × | × | × |  |
| 12 | 200 | 10 | 50 | 20 | × | × | × | × |  |

| Example | Shape of conductor post | | Voltage drop amount (V) | Occurrence of Malfunction of IC |
|---|---|---|---|---|
| | Maximum diameter ($\mu$m) | Minimum diameter ($\mu$m) | | |
| 13 | 40 | 18 | 0.253 | YES |
| 14 | 40 | 25 | 0.235 | YES |
| 15 | 40 | 30 | 0.207 | YES |
| 16 | 40 | 33 | 0.163 | NO |
| 17 | 40 | 35 | 0.150 | NO |
| 18 | 40 | 40 | 0.140 | NO |

| Simulation No. | Aspect ratio of conductor post | Stress ratio |
|---|---|---|
| 1 | 1 | 1 |
| 2 | 2 | 0.92 |
| 3 | 3 | 0.87 |
| 4 | 4 | 0.65 |
| 5 | 5 | 0.45 |
| 6 | 6 | 0.40 |
| 7 | 7 | 0.32 |

Fig. 13

| Example | Shape of conductor post | | | | | Heat cycle (-th) | | | | | | |
|---|---|---|---|---|---|---|---|---|---|---|---|---|
| | Height | Minimum diameter | Maximum diameter | Rasp | Maximum/Minimum | 500 | 750 | 1000 | 1500 | 1750 | 2000 | 2500 |
| 19 | 200 | 100 | 120 | 2.0 | 1.2 | ○ | × | × | × | × | × | × |
| 20 | 200 | 60 | 120 | 3.3 | 2.0 | ○ | △ | × | × | × | × | × |
| 21 | 100 | 25 | 50 | 4.0 | 2.0 | ○ | ○ | ○ | △ | × | × | ○ |
| 22 | 125 | 31 | 110 | 4.0 | 3.5 | ○ | ○ | ○ | ○ | ○ | ○ | ○ |
| 23 | 200 | 50 | 120 | 4.0 | 2.4 | ○ | ○ | ○ | ○ | ○ | ○ | ○ |
| 24 | 240 | 60 | 120 | 4.0 | 2.0 | ○ | ○ | ○ | ○ | ○ | ○ | ○ |
| 25 | 125 | 31 | 60 | 4.0 | 1.9 | ○ | ○ | ○ | ○ | ○ | △ | × |
| 26 | 200 | 50 | 90 | 4.0 | 1.8 | ○ | ○ | ○ | ○ | ○ | △ | × |
| 27 | 240 | 60 | 100 | 4.0 | 1.7 | ○ | ○ | ○ | ○ | ○ | △ | × |
| 28 | 260 | 65 | 130 | 4.0 | 2.0 | ○ | ○ | ○ | ○ | △ | × | × |
| 29 | 320 | 80 | 160 | 4.0 | 2.0 | ○ | ○ | ○ | ○ | △ | × | × |
| 30 | 340 | 85 | 200 | 4.0 | 2.4 | ○ | ○ | ○ | △ | × | × | × |
| 31 | 200 | 40 | 80 | 5.0 | 2.0 | ○ | ○ | ○ | ○ | ○ | ○ | ○ |
| 32 | 200 | 40 | 120 | 5.0 | 3.0 | ○ | ○ | ○ | ○ | ○ | ○ | ○ |
| 33 | 200 | 35 | 120 | 5.7 | 3.4 | ○ | ○ | ○ | ○ | ○ | ○ | ○ |
| 34 | 175 | 27 | 80 | 6.5 | 3.0 | ○ | ○ | ○ | △ | × | × | × |
| 35 | 200 | 31 | 100 | 6.5 | 3.2 | ○ | ○ | ○ | ○ | ○ | ○ | ○ |
| 36 | 325 | 50 | 100 | 6.5 | 2.0 | ○ | ○ | ○ | ○ | ○ | ○ | ○ |
| 37 | 390 | 60 | 120 | 6.5 | 2.0 | ○ | ○ | ○ | ○ | ○ | ○ | ○ |
| 38 | 200 | 31 | 60 | 6.5 | 1.9 | ○ | ○ | ○ | ○ | ○ | △ | × |
| 39 | 325 | 50 | 80 | 6.5 | 1.6 | ○ | ○ | ○ | ○ | ○ | △ | × |
| 40 | 390 | 60 | 100 | 6.5 | 1.7 | ○ | ○ | ○ | ○ | ○ | △ | × |
| 41 | 420 | 65 | 130 | 6.5 | 2.0 | ○ | ○ | ○ | ○ | △ | × | × |
| 42 | 520 | 80 | 200 | 6.5 | 2.5 | ○ | ○ | ○ | ○ | △ | × | × |
| 43 | 540 | 83 | 200 | 6.5 | 2.4 | ○ | ○ | ○ | △ | × | × | × |
| 44 | 230 | 33 | 70 | 7.0 | 2.1 | ○ | ○ | ○ | ○ | × | × | × |
| 45 | 350 | 50 | 100 | 7.0 | 2.0 | ○ | ○ | ○ | ○ | × | × | × |
| 46 | 420 | 60 | 120 | 7.0 | 2.0 | ○ | ○ | ○ | ○ | × | × | × |
| 47 | 330 | 33 | 70 | 10.0 | 2.1 | ○ | ○ | ○ | ○ | × | × | × |
| 48 | 400 | 32 | 70 | 12.5 | 2.2 | ○ | ○ | ○ | ○ | × | × | × |
| 49 | 515 | 31 | 70 | 16.6 | 2.3 | ○ | ○ | ○ | ○ | × | × | × |
| 50 | 200 | 10 | 50 | 20.0 | 5.0 | × | × | × | × | × | × | × |
| 51 | 620 | 31 | 50 | 20.0 | 1.6 | × | × | × | × | × | × | × |
| 52 | 200 | 100 | 100 | 2.0 | 1.0 | × | × | × | × | × | × | × |
| 53 | 200 | 60 | 60 | 3.3 | 1.0 | × | × | × | × | × | × | × |
| 54 | 100 | 25 | 25 | 4.0 | 1.0 | ○ | ○ | △ | × | × | × | × |
| 55 | 124 | 31 | 31 | 4.0 | 1.0 | ○ | ○ | ○ | △ | × | × | × |
| 56 | 200 | 50 | 50 | 4.0 | 1.0 | ○ | ○ | ○ | △ | × | × | × |
| 57 | 240 | 60 | 60 | 4.0 | 1.0 | ○ | ○ | ○ | △ | × | × | × |
| 58 | 250 | 62 | 62 | 4.0 | 1.0 | ○ | ○ | ○ | × | × | × | × |
| 59 | 320 | 80 | 80 | 4.0 | 1.0 | ○ | ○ | ○ | × | × | × | × |
| 60 | 340 | 85 | 85 | 4.0 | 1.0 | ○ | ○ | ○ | △ | × | × | × |
| 61 | 200 | 40 | 40 | 5.0 | 1.0 | ○ | ○ | ○ | △ | × | × | × |
| 62 | 175 | 27 | 27 | 6.5 | 1.0 | ○ | ○ | △ | × | × | × | × |
| 63 | 200 | 31 | 31 | 6.5 | 1.0 | ○ | ○ | ○ | △ | × | × | × |
| 64 | 325 | 50 | 50 | 6.5 | 1.0 | ○ | ○ | ○ | △ | × | × | × |
| 65 | 390 | 60 | 60 | 6.5 | 1.0 | ○ | ○ | ○ | △ | × | × | × |
| 66 | 410 | 63 | 63 | 6.5 | 1.0 | ○ | ○ | ○ | × | × | × | × |
| 67 | 520 | 80 | 80 | 6.5 | 1.0 | ○ | ○ | ○ | × | × | × | × |
| 68 | 540 | 83 | 83 | 6.5 | 1.0 | ○ | ○ | △ | × | × | × | × |
| 69 | 245 | 35 | 35 | 7.0 | 1.0 | ○ | ○ | ○ | × | × | × | × |
| 70 | 330 | 33 | 33 | 10.0 | 1.0 | ○ | ○ | △ | × | × | × | × |
| 71 | 400 | 32 | 32 | 12.5 | 1.0 | ○ | ○ | △ | × | × | × | × |
| 72 | 515 | 31 | 31 | 16.6 | 1.0 | ○ | ○ | △ | × | × | × | × |
| 73 | 200 | 10 | 10 | 20.0 | 1.0 | × | × | × | × | × | × | × |

Height, minimum diameter, and maximum diameter are shown by $\mu m$

Fig. 14

| Example | Shape of conductor post ||||| Heat cycle (-th) |||||||
|---|---|---|---|---|---|---|---|---|---|---|---|---|
| | Height | Minimum diameter | Maximum diameter | Rasp | Maximum/Minimum | 500 | 750 | 1000 | 1500 | 1750 | 2000 | 2500 |
| 74 | 100 | 25 | 50 | 4.0 | 2.0 | ○ | ○ | ○ | △ | × | × | × |
| 75 | 125 | 31 | 110 | 4.0 | 3.5 | ○ | ○ | ○ | ○ | ○ | ○ | ○ |
| 76 | 200 | 50 | 120 | 4.0 | 2.4 | ○ | ○ | ○ | ○ | ○ | ○ | ○ |
| 77 | 240 | 60 | 120 | 4.0 | 2.0 | ○ | ○ | ○ | ○ | ○ | ○ | ○ |
| 78 | 125 | 31 | 60 | 4.0 | 1.9 | ○ | ○ | ○ | ○ | ○ | △ | × |
| 79 | 200 | 50 | 90 | 4.0 | 1.8 | ○ | ○ | ○ | ○ | ○ | △ | × |
| 80 | 240 | 60 | 100 | 4.0 | 1.7 | ○ | ○ | ○ | ○ | ○ | △ | × |
| 81 | 260 | 65 | 130 | 4.0 | 2.0 | ○ | ○ | ○ | ○ | △ | × | × |
| 82 | 320 | 80 | 160 | 4.0 | 2.0 | ○ | ○ | ○ | ○ | △ | × | × |
| 83 | 340 | 85 | 200 | 4.0 | 2.4 | ○ | ○ | ○ | △ | × | × | × |
| 84 | 100 | 25 | 50 | 4.0 | 2.0 | ○ | ○ | ○ | △ | × | × | × |
| 85 | 125 | 31 | 110 | 4.0 | 3.5 | ○ | ○ | ○ | ○ | ○ | ○ | ○ |
| 86 | 200 | 50 | 120 | 4.0 | 2.4 | ○ | ○ | ○ | ○ | ○ | ○ | ○ |
| 87 | 240 | 60 | 120 | 4.0 | 2.0 | ○ | ○ | ○ | ○ | ○ | ○ | ○ |
| 88 | 125 | 31 | 60 | 4.0 | 1.9 | ○ | ○ | ○ | ○ | ○ | △ | × |
| 89 | 200 | 50 | 90 | 4.0 | 1.8 | ○ | ○ | ○ | ○ | ○ | △ | × |
| 90 | 240 | 60 | 100 | 4.0 | 1.7 | ○ | ○ | ○ | ○ | ○ | △ | × |
| 91 | 260 | 65 | 130 | 4.0 | 2.0 | ○ | ○ | ○ | ○ | △ | × | × |
| 92 | 320 | 80 | 160 | 4.0 | 2.0 | ○ | ○ | ○ | ○ | △ | × | × |
| 93 | 340 | 85 | 200 | 4.0 | 2.4 | ○ | ○ | ○ | △ | × | × | × |
| 94 | 100 | 25 | 50 | 4.0 | 2.0 | ○ | ○ | △ | × | × | × | × |
| 95 | 125 | 31 | 110 | 4.0 | 3.5 | ○ | ○ | ○ | ○ | ○ | ○ | × |
| 96 | 200 | 50 | 120 | 4.0 | 2.4 | ○ | ○ | ○ | ○ | ○ | ○ | × |
| 97 | 240 | 60 | 120 | 4.0 | 2.0 | ○ | ○ | ○ | ○ | ○ | ○ | × |
| 98 | 125 | 31 | 60 | 4.0 | 1.9 | ○ | ○ | ○ | ○ | △ | × | × |
| 99 | 200 | 50 | 90 | 4.0 | 1.8 | ○ | ○ | ○ | ○ | △ | × | × |
| 100 | 240 | 60 | 100 | 4.0 | 1.7 | ○ | ○ | ○ | ○ | △ | × | × |
| 101 | 260 | 65 | 130 | 4.0 | 2.0 | ○ | ○ | ○ | △ | × | × | × |
| 102 | 320 | 80 | 160 | 4.0 | 2.0 | ○ | ○ | ○ | △ | × | × | × |
| 103 | 340 | 85 | 200 | 4.0 | 2.4 | ○ | ○ | △ | × | × | × | × |
| 104 | 100 | 25 | 50 | 4.0 | 2.0 | ○ | ○ | △ | × | × | × | × |
| 105 | 125 | 31 | 110 | 4.0 | 3.5 | ○ | ○ | ○ | ○ | ○ | ○ | × |
| 106 | 200 | 50 | 120 | 4.0 | 2.4 | ○ | ○ | ○ | ○ | ○ | ○ | × |
| 107 | 240 | 60 | 120 | 4.0 | 2.0 | ○ | ○ | ○ | ○ | ○ | ○ | × |
| 108 | 125 | 31 | 60 | 4.0 | 1.9 | ○ | ○ | ○ | ○ | △ | × | × |
| 109 | 200 | 50 | 90 | 4.0 | 1.8 | ○ | ○ | ○ | ○ | △ | × | × |
| 110 | 240 | 60 | 100 | 4.0 | 1.7 | ○ | ○ | ○ | ○ | △ | × | × |
| 111 | 260 | 65 | 130 | 4.0 | 2.0 | ○ | ○ | ○ | △ | × | × | × |
| 112 | 320 | 80 | 160 | 4.0 | 2.0 | ○ | ○ | ○ | △ | × | × | × |
| 113 | 340 | 85 | 200 | 4.0 | 2.4 | ○ | ○ | △ | × | × | × | × |

Height, minimum diameter, and maximum diameter are shown by $\mu m$

MULTILAYER PRINTED WIRING BOARD

Cross-Reference to Related Applications

The present invention is a continuation of International Application No. PCT/JP2005/010099, filed on May 26, 2005, which claims priority from Japanese Patent Application No. 2004-157459, filed on May 27, 2004.

TECHNICAL FIELD

The present invention relates to a multilayer printed wiring board.

BACKGROUND ART

High functionalization and miniaturization have been remarkable for electronic equipment represented by portable information terminals and communications terminals. A flip chip system in which IC chips are directly mounted on the surface of a multilayer printed wiring board has been adopted as a manner of mounting IC chips used for these electronic equipment on a multilayer printed wiring board in high density. One known multilayer printed wiring board is equipped with a core board, a build-up layer formed on the core board, and mounting electrodes on which an IC chip is mounted via soldering bumps on the upper surface of the build-up layer. Here, as a core board used is a material formed by molding epoxy resin, BT (bismaleimide/triazine) resin, polyimide resin, polybutadiene resin, phenol resin or the like together with reinforcing material such as glass fiber or the like. The thermal expansion coefficient of the core substrate thus formed is equal to about 12 to 20 ppm/° C. (30 to 200° C.), and is equal to about four times or more of the thermal expansion coefficient of silicon of IC chips (about 3.5 ppm/° C.). Accordingly, in the case of the above-described flip chip system, when temperature variation caused by heating of an IC chip is repeated, soldering bumps and the IC chip (an interlayer insulating layer is made porous) may be broken due to the difference in the thermal expansion amount and thermal contraction amount between the IC chip and the core board.

In order to solve this problem, there has been proposed a multilayer printed wiring board in which a stress relaxation layer having a low coefficient of elasticity is provided on the build-up layer, mounting electrodes are provided on the upper surface of the stress relaxation layer, and a conductor pattern on the build-up layer and the mounting electrodes are connected to each other by conductor posts (JP 58-28848 A and JP 2001-36253 A). For example, as shown in FIG. 12 of the disclosure of JP 2001-36253 A, a multilayer printed wiring board 100 includes a low-elasticity layer 140 that is laminated on the upper surface of a build-up layer 130, and a conductor pattern 132 on the upper surface of the build-up layer 130 and mounting electrodes 152 formed on the upper surface of the low-elasticity layer 140 that are connected to each other by a via hole 150. Furthermore, in disclosure of JP 2001-36253 A, thermoplastic resin such as polyolefin resin or polyimide resin, thermosetting resin such as silicone resin, modified epoxy resin containing rubber such as NBR or the like is used as a specific example of the resin for forming the low-elasticity layer 140.

DISCLOSURE OF THE INVENTION

In disclosure of JP 2001-36253 A, resin having a low glass-transition temperature (Tg) is used as the resin for forming the low-elasticity layer 140. However, when a thermal treatment process is executed to make a printed wiring board or the printed wiring board is actually used, the temperature of the printed wiring board exceeds the Tg due to heating of an IC chip operating in a high frequency region, etc., in some cases. When the temperature exceeds the Tg, the low-elasticity layer expands about ten times of that of the printed wiring board because the thermal expansion coefficient thereof becomes equal to a large value (several hundreds ppm/° C.), and thus there occurs such a problem that separation is likely to occur between the printed wiring board and the low-elasticity layer. Furthermore, in the high-temperature region, the low-elasticity layer expands significantly more as compared with the conductor penetrating via the low-elasticity layer, and thus there is a problem that the conductor suffers stress and thus it is liable to be broken. Particularly when an IC having an operating clock in a high frequency region (for example, 3 GHz or more) is mounted, this problem is more remarkable due to heat.

The present invention has been made in order to solve the above problems, and an object of the invention is to provide a multilayer printed wiring board in which separation of a low-elasticity layer can be prevented even under high temperature and connection reliability of conductor posts penetrating through the low-elasticity layer can be secured.

The inventors have been dedicated to carrying out studies, and have found that in Japanese Published Unexamined Patent Application No. 2001-36253, the low-elasticity layer is formed of resin having a low Tg and thus separation is liable to occur between the printed wiring board and the low-elasticity layer, and they have completed the present invention.

A multilayer printed wiring board of the present invention includes a core board, a build-up layer that is formed on the core board and has an upper surface provided with a conductor pattern, a low-elasticity layer (a layer having a low coefficient of elasticity) formed on the build-up layer, mounting electrodes that are provided on the upper surface of the low-elasticity layer and connected to electrical parts via a connection portion, and conductor posts penetrating through the low-elasticity layer to electrically connect the mounting electrodes and the conductor posts, and the low-elasticity layer is formed of epoxy resin, phenol resin, cross-linked rubber particles and resin composition containing a curing catalyst.

In the multilayer printed wiring board, the low-elasticity layer is formed of epoxy resin, phenol resin, cross-linked rubber particles and resin composition containing a curing catalyst, and thus it has a high Tg (about 100 to 200° C.). Therefore, even when the temperature of the low-elasticity layer is increased by a thermal treatment process when the printed wiring board is manufactured or heating of electrical parts (particularly, an IC chip whose operation clock is equal to 3 GHz or more), etc., the temperature of the low-elasticity layer does not exceed the Tg, and thus it is prevented from excessively expanding. Accordingly, even under high temperature, separation of the low-elasticity layer can be prevented, and also the connection reliability of the conductor posts penetrating through the low-elasticity layer can be secured.

The epoxy resin used in the present invention is not limited to a specific one insofar as it is used for an interlayer insulating film, flattening film of a multilayer circuit board, protection film, electrical insulating film, etc., for electrical parts, etc., however, the following materials may be used as epoxy resin: bisphenol A type epoxy, bisphenol F type epoxy, hydrogenerated bisphenol A type epoxy, hydrogenerated bisphenol F type epoxy, bisphenol S type epoxy, brominated bisphenol A type epoxy, biphenyl type epoxy, naphthalene type epoxy, fluorene type epoxy, spiro ring type epoxy, bisphenol alkane group epoxy, phenol novolac type epoxy, orthocresol novolac type epoxy, brominated cresol novolac type epoxy, trishydroxymethane type epoxy, tetraphenylolethane type epoxy, alicyclic type epoxy, alcohol type epoxy, butyl glycidyl ether, phenyl glycidyl ether, cresyl glycidyl ether, nonylglycidyl ether, diethylene glycol diglycidyl ether, polyethylene glycol diglycidyl ether, polypropylene glycol diglycidyl ether, glycerin polyglycidyl ether, neopentyl glycol diglycidyl ether, 1,6-hexanediol diglycidyl ether, trimethylol propane triglycidyl ether, hexahydrophthalic acid diglycidyl ether, fatty acid denatured epoxy, toluidine type epoxy, aniline type epoxy, aminophenol type epoxy, 1,3-bis(N, N-diglycidyl aminomethyl) cyclohexane, hydantoin type epoxy, triglycidyl isocyanurate, tetraglycidyl diaminodiphenyl methane, diphenyl ether type epoxy, dicyclopentadiene type epoxy, dimer acid diglycidylester, hexahydrophthalic acid diglycidyl ester, dimer acid diglycidyl ether, silicone denatured epoxy, silicon-contained epoxy, urethane denatured epoxy, NBR denatured epoxy, CTBN denatured epoxy, epoxidized polybutadiene, etc.

The phenol resin used in the present invention is as follows: phenol novolac resin, cresol novolac resin, alkyl phenol novolac resin, resole resin, polyvinyl phenol resin, etc. Novolac resin is achieved by condensing a phenol group and aldehyde group under the existence of a catalyst. As the phenol group phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, β-naphthol, etc., may be used. As the aldehyde group formaldehyde, paraformaldehyde, acetaldehyde, benzaldehyde, etc., maybe used. As the novolac resin thus achieved, phenol/formaldehyde condensed novolac resin, cresol/formaldehyde condensed novolac resin, phenolnaphthol/formaldehyde condensed novolac resin, etc, may be used. As resin other than novolac resin polyhydroxystylene and copolymer thereof, phenol-xylyleneglycol condensation resin, cresol-xylylene glycol condensation resin, phenol-dicyclopentadiene condensation resin, etc., may be used.

It is preferable that phenol resin used in the present invention is blended by 5 to 100 parts by weight, more preferably 10 to 50 parts by weight with respect to the 100 parts by weight of epoxy resin. If the blend amount exceeds the upper limit of the above range, the elasticity coefficient of a hardened film achieved by thermosetting may exceed 1 GPa. If the blend amount is lower than the lower limit of the above range, the thermal resistance of the hardened film may be lowered.

With respect to the cross-linked rubber particles used in the present invention, it is preferable that the glass-transition temperature (Tg) thereof ranges from −100° C. to 0° C., more preferably from −80° C. to −20° C. With respect to the cross-linked rubber particles as described above, it is preferable that each rubber particle is formed of a copolymer of a cross-linking monomer having at least two polymerizable unsaturated bonds (hereinafter referred to as a "cross-linking monomer") and a monomer other than the above cross-linking monomer (hereinafter referred to as "another monomer"), and the other monomer is at least one kind of monomer selected so that the Tg of the copolymer ranges from −100° C. to 0° C. More preferably, as the other monomer, a monomer having a functional group having no polymerizable unsaturated bond, for example, carboxyl group, epoxy group, amino group, isocyanate group, hydroxyl group or the like may be used. As the cross-linking monomer, a compound having at least two polymerizable unsaturated bonds such as divinylbenzene, diallyl phthalate, ethylene glycol di(meta) acrylate, propylene glycol di(meta) acrylate, trimethylolpropane tri(meta)acrylate, pentaerythritol tri(meta) acrylate, polyethylene glycol di(meta)acrylate, polypropylene glycol di(meta) acrylate, etc., may be used. Divinylbenzene is most preferably used among the above materials. As "another monomer," vinyl compounds such as butadiene, isoprene, dimethyl butadiene, chloroprene, etc.; unsaturated nitrile compounds such as 1,3-pentadiene, (meta)acrylonitrile, α-chloroacrylonitrile, α-chloro methylacrylonitrile, α-methoxy acrylonitrile, α-ethoxy acrylonitrile, nitrile crotonate, nitrile cinnamate, dinitrile itaconate, dinitrile maleate, dinitrile fumarate, etc.; unsaturated amide group such as (meta)acryl amide, N,N'-methylene bis(meta)acrylatmide, N,N'-ethylene bis(meta)acrylamide, N, N'-hexamethylene bis (meta)acryl amide, N-hydroxymethyl (meta)acrylamide, N-(2-hydroxyethyl)(meta) acrylamide, N, N'-bis(2-hydroxyeyhyl)(meta) acrylamide, amide crotonate, cinnamate amide, etc.; (meta) acrylic acid esters such as (meta) methyl acrylate, (meta) ethyl acrylate, (meta) propyl acrylate, (meta) butyl acrylate, (meta) hexyl acrylate, (meta) lauryl acrylate, polyethylene glycol (meta) acrylate, polypropylene glycol (meta) acrylate; aromatic vinyl compounds such as α-methyl styrene, o-methoxy styrene, p-hydroxy styrene, p-isopropenyl phenol, etc.; epoxy(meta)acrylate groups achieved by reaction of diglycidyl ether of bisphenol A or diglycidyl ether of glycol and (meta) acrylic acid or hydroxy alkyl (meta) acrylate; urethane (meta) acrylate groups achieved by reaction of hydroxyl alkyl (meta) acrylate and polyisocyanate; epoxy-group contained unsaturated compounds such as glycidyl (meta) acrylate, (meta) allyl glycidyl ether; unsaturated compounds such as (meta) acrylic acid, itaconic acid, succinate-β-(meta) acryloxyethyl, maleic acid-β-(meta)acrloxyethyl, phthalic acid-β-(meta)acrloxyethyl, hexahydro phthalic acid-β-(meta)acrloxyethyl, etc.; aminogroup contained unsaturated compounds such as dimethyl amino (meta) acrylate, diethyl amino (meta) acrylate, etc.; amido-group contained unsaturated compounds such as (meta) acrylamide, dimethyl (meta) acrylamide, etc.; hydroxyl-group contained unsaturated compounds such as hydroxyethyl (meta) acrylate, hydroxypropyl (meta) acrylate, hydroxybutyl (meta) acrylate, etc. Of these materials, butadiene, isoprene, (meta) acrylonitrile, (meta) acrylic acid alkyl ester group, styrene, p-hydroxy styrene, p-isopropenyl phenol, glycidyl (meta) acrylate, (meta) acrylic acid, hydroxyl alkyl (meta) acrylate, etc., maybe used. The cross-linking monomer used in the present invention is preferably used by 1 to 20 parts by weight, more preferably by 2 to 10 parts by weight with respect to the total monomer amount used when the cross-linked rubber particles are manufactured.

The size of the cross-linked rubber particles used in the present invention is normally set to 30 to 500 nm, preferably 40 to 200 nm. A method of controlling the particle size of the cross-linked rubber particles is not limited to a specific one. However, when the cross-linked rubber particles are synthesized by emulsion polymerization, it is possible to control the particle size by adjusting the amount of emulsifying agent to control the number of micells being used. In the present invention, the cross-linked rubber particles is preferably blended by 50 to 200 parts by weight, more preferably by 70 to 180 parts by weight with respect to the epoxy resin of 100 parts by weight. If the blend amount is less than the lower limit of the above range, the efficiency of elasticity of hardened film achieved by thermosetting may exceed 1 GPa. On the other hand, if the blend amount exceeds the upper limit of the above range, the thermal resistance of the hardened film would be lowered or compatibility with other components in resin composition may be lowered.

The manufacturing method of the cross-linked rubber particles used in the present invention is not limited to a specific one, and for example an emulsion polymerization method may be used. According to the emulsion polymerization method, a monomer group containing cross-linking monomers are emulsified in water by using surface active agent, radical polymerization initiator such as a peroxide catalyst, redox catalyst or the like is added as a polymerization initiator, and a molecular weight adjusting agent such as a mercaptan compound, halogenated hydrocarbon or the like is added as needed. Subsequently, polymerization is conducted at 0 to 50° C., and after the polymerization inversion rate reaches a predetermined value, a reaction stop agent such as N,N-diethylhydroxylamine or the like is added to stop the polymerization reaction. Thereafter, non-reacted monomers of the polymerization system are removed by steam distillation or the like to synthesize latex containing cross-linked rubber particles. The surface active agent used in the emulsion polymerization method is not limited to a specific material insofar as it can manufacture cross-linked rubber particles by emulsion polymerization. For example, as the surface active agent, anion type surface active agent such as salt of alkyl naphthalenesulfonic acid, salt of alkyl benzenesulfonic acid or the like; cation type surface active agent such as salt of alkyl trimethyl ammonium, salt of dialkyl dimethyl ammonium or the like; nonion type surface active agent such as polyoxyethylene alkyl ether, polyoxyethylene alkyl allyl ether, polyoxyethylene fatty acid ester, polyoxyethylene sorbitan fatty acid ester, fatty acid monoglyceride or the like; amphoteric surface active agent; reactive emulsifying agent or the like may be used. These surface active agents may be used alone or while two or more kinds of surface active agents are mixed with each other, The latex containing the cross-linked rubber particles achieved by the emulsion polymerization is coagulated by a method such as salting-out or the like, washed with water and dried, whereby the cross-linked rubber particles can be achieved. Furthermore, as a method of manufacturing cross-linked rubber particles without using any cross-linking monomer, a method of adding a cross-linking agent such as peroxide or the like to the latex to cross-link latex particles, a method of gelatinizing latex particles by increasing the polymerization inversion rate, a method of adding a cross-linking agent such as metal salt or the like by using a functional group such as a carboxy group or the like to cross-linking latex particles, etc., may be used.

The hardening catalyst used in the present invention is not limited to a specific one, however, for example, an amine group, carboxylic acid group, acid anhydride, dicyandiamide, dihydrazide dibasic acid, imidazole group, organic boron, organic phosphine, guanidine group, salts of the above compounds, etc., may be used. These compounds may be used alone or while two or more kinds are combined with each other. The hardening catalyst is preferably added by 0.1 to 20 parts by weight, more preferably by 0.5 to 10 parts by weight with respect to the epoxy resin of 100 parts by weight. Furthermore, a hardening promoting agent may be used in combination with the hardening catalyst to promote the hardening reaction as needed.

With respect to the resin composition used in the present invention, when the phenol resin is contained by 5 to 100 parts by weight, the cross-linked rubber particles are contained by 5 to 200 parts by weight and the hardening catalyst is contained by 0.1 to 20 parts by weight with respect to the epoxy resin of 100 parts by weight, the glass-transition temperature Tg ranges from 120 to 200° C. When the phenol resin is contained by 10 to 50 parts by weight, the cross-linked rubber particles are contained by 7 to 180 parts by weight and the hardening catalyst is contained by 0.5 to 10 parts by weight with respect to the epoxy resin of 100 parts by weight, the glass-transition temperature Tg ranges from 140 to 200° C.

In the multilayer printed wiring board of the present invention, in order to enhance the handle ability of the resin composition to form the low-elasticity layer and adjust the viscosity and the preservation stability, organic solvent may be used for the resin composition as needed. The organic solvent used in the present invention is not limited to a specific one, and for example, as the organic solvent, an ethylene glycol monoalkyl ether acetate group such as ethylene glycol monomethyl ether acetate, ethylene glycol monoethyl ether acetate, etc.; propylene glycol monoalkyl ether group such as propylene glycol monomethyl ether, propylene glycol monoethyl ether, propylene glycol monopropyl ether, propylene glycol monobutyl ether, etc.; propylene glycol dialkyl ether group such as propylene glycol dimethyl ether, propylene glycol diethyl ether, propylene glycol dipropyl ether, propylene glycol dibutyl ether, etc.; propylene glycol monoalkyl ether acetate group such as propylene glycol monomethyl ether acetate, propylene glycol monoethyl ether acetate, propylene glycol monopropyl ether acetate, propylene glycol monobutyl ether acetate, etc.; cellosolve group such as ethyl cellosolve, butyl cellosolve, etc.; carbitol group such as butyl carbitol, etc.; lactic acid ester group such as methyl lactate, ethyl lactate, n-propyl lactate, isopropyl lactate, etc.; aliphatic carboxylate ester such as ethyl acetate, n-propyl acetate, isopropyl acetate, n-butyl acetate, isobutyl acetate, n-amyl acetate, isoamyl acetate, isopropyl propionate, n-butyl propionate, isobutyl propionate, etc.; other ester groups such as methyl 3-methoxy propionate, ethyl 3-methoxypropionate, methyl 3-ethoxypropionate, ethyl 3-ethoxypripionate, methyl pyruvate, ethyl pyruvate, etc.; aromatic group hydrocarbon such as toluene, xylene, etc.; ketone group such as 2-butanone, 2-heptanone, 3-heptanone, 4-heptanone, cyclohexanone, etc.; amide group such as n-dimethyl formamide, N-methyl acetamide, N,N-dimethyl acetamide, N-methyl pyrrolidone, etc.; lactone group such as γ-butyrolactone, etc., may be used. These organic solvents may be used alone or while two or more kinds of solvents are mixed with one another.

In the multilayer printed wiring board of the present invention, the resin composition for forming the low-elasticity layer may be added with other additives as needed. Such additives may contain inorganic filler, adhesion assisting agent, polymer additive, reaction diluent, levering agent, wettability improving agent, surface active agent, plasticizer, oxidant inhibitor, antistatic agent, inorganic filler, mildewcide, humidity conditioning agent, fire retardant, etc. These additives may be used to the extent that the effect of the present invention is not lost.

The hardening condition of the resin composition forming the low-elasticity layer is not limited to specific ones, however, they may be heated in a temperature range from 50 to 200° C. for about 10 minutes to 48 hours in accordance with an application of the hardened material thus achieved. Furthermore, they may be heated at two stages in order to sufficiently promote hardening or preventing the occurrence of bubbles. For example, in the first stage, the resin composition may be heated in a temperature range from 50 to 100° C. for about 10 minutes to 10 hours, and in the second stage, the resin composition may be heated in a temperature range from 80 to 200° C. for about 30 minutes to 12 hours to be hardened. Such heating may be carried out by using heating equipment such as a general oven, an infrared furnace or the like.

In the multilayer printed wiring board of the present invention, it is preferable that the conductor post has the aspect ratio Rasp of not less than 4 and less than 20. Under this condition, even when stress caused by the difference in the thermal expansion coefficient between the core board and electrical parts occurs, the stress can be reliably relaxed, so that the breaking of the connection with the electrical parts due to thermal expansion/thermal contraction can be prevented. Furthemore, the variation rate of the electrical resistance when heating/cooling is repeated can be suppressed to a small level, and thus power can be stably supplied to the installed electrical parts. It is estimated that the reason why such an effect is achieved resides in that the aspect ratio Rasp of the conductor post is large and thus it is deformed in conformity with the low-elasticity layer. In the present invention, the aspect ratio Rasp of the conductor post means a value achieved by dividing the height of the conductor post by the diameter of the conductor post (the minimum diameter when the diameter is not uniform).

In the multilayer printed wiring board of the present invention, when the aspect ratio Rasp of the conductor post is less than 4, the electrical resistance significantly varies when the heating/cooling is repeated, and thus this condition is unfavorable. Furthermore, when the aspect ratio Rasp of the conductor post is equal to or more than 20, cracks may occur in the conductor post when the heating/cooking is repeated, and thus this condition is also unfavorable. In other words, when the aspect ratio Rasp is less than 4, the conductor post is not deformed, and it prevents deformation of the low-elasticity layer. Therefore, this condition is unfavorable. When the aspect ratio Rasp is equal to or more than 20, the conductor post is excessively deformed, and thus fatigue breaking occurs. Therefore, this condition is also unfavorable. The aspect ratio Rasp is preferably set to not less than 4 and not more than 6.5.

In the multilayer printed wiring board, it is preferable that the diameter of the conductor post exceeds 30 μm. This condition can suppress voltage drop when power is supplied to the installed electrical parts, and prevent malfunction of the electrical parts. Furthermore, the electrical resistance of the conductor post can be suppressed to low levels. In the case of an IC chip having electrical parts of 1 GHz or less, voltage drop hardly occurs even when the conductor post is designed to be 30 μm in diameter. However, in the case of a high-speed IC chip of 3 GHz or more, the voltage drop is remarkable, and thus it is preferable that the diameter of the conductor post exceeds 30 μm. When the thickness of the conductor post is not uniform, it is preferable that the diameter of the narrowest part of the conductor post exceeds 30 μm. This is because the conductor resistance of the conductor post is reduced or the resistance to fatigue degradation and the resistance to a heat cycle are enhanced. It is preferable that the diameter of the conductor post is more than 30 μm and not more than 60 μm.

In the multilayer printed wiring board of the present invention, the conductor post may be designed in a shape having a constricted part. With this construction, the variation rate of the electrical resistance when heating/cooling is repeated can be further suppressed as compared with the conductor post having a substantially straight shape. This is because the conductor post is deformed in conformity with the low-elasticity layer with the constricted part as the center (starting point). The constricted part means apart which is narrower than the upper and lower portions with respect to the part when the conductor post is viewed along the axial direction. In the conductor post with a shape having such a constricted part, it is preferable that the diameter of the thickest part is set to be twice or more as large as that of the narrowest part of the conductor post (that is, the ratio of the thickest part to the narrowest part is preferably not less than 2).

In the multilayer printed wiring board of the present invention, the mounting electrodes may be set to the apex portion of the conductor post formed so as to form substantially the same plane as the upper surface of the low-elasticity layer. With this construction, the mounting electrodes can be more simply manufactured as compared with a case where the mounting electrodes are formed separately from the conductor post.

In the multilayer printed wiring board of the present invention, it is preferable that the low-elasticity layer has a Young's modulus of 10 MPa to 1 GPa at 30° C. Under this condition, the stress caused by the difference in the thermal expansion coefficient can be further reliably relaxed. Furthermore, the Young's modulus of the low-elasticity layer at 30° C. more preferably ranges from 10 MPa to 500 MPa, and most preferably from 10 MPa to 100 MPa. Furthermore, it is preferable that the conductor post is formed of material having excellent electrical conductivity, and for example, it is preferably formed of copper, solder, or alloy containing any one of the above materials.

BRIEF DESCRIPTION OF THE DRAWINGS

FIG. 9 is a table showing the relationship between the shape of a conductor post and the variation rate of electrical resistance;

FIG. 13 is a table showing the relationship between the shape of the conductor post and the variation rate of the electrical resistance; and FIG. 14 is a table showing the relationship between the shape of the conductor post and the variation rate of the electrical resistance.

DESCRIPTION OF THE PREFERRED EMBODIMENTS

One embodiment of the present invention will be described with reference to the accompanying drawings.

Figure 1:
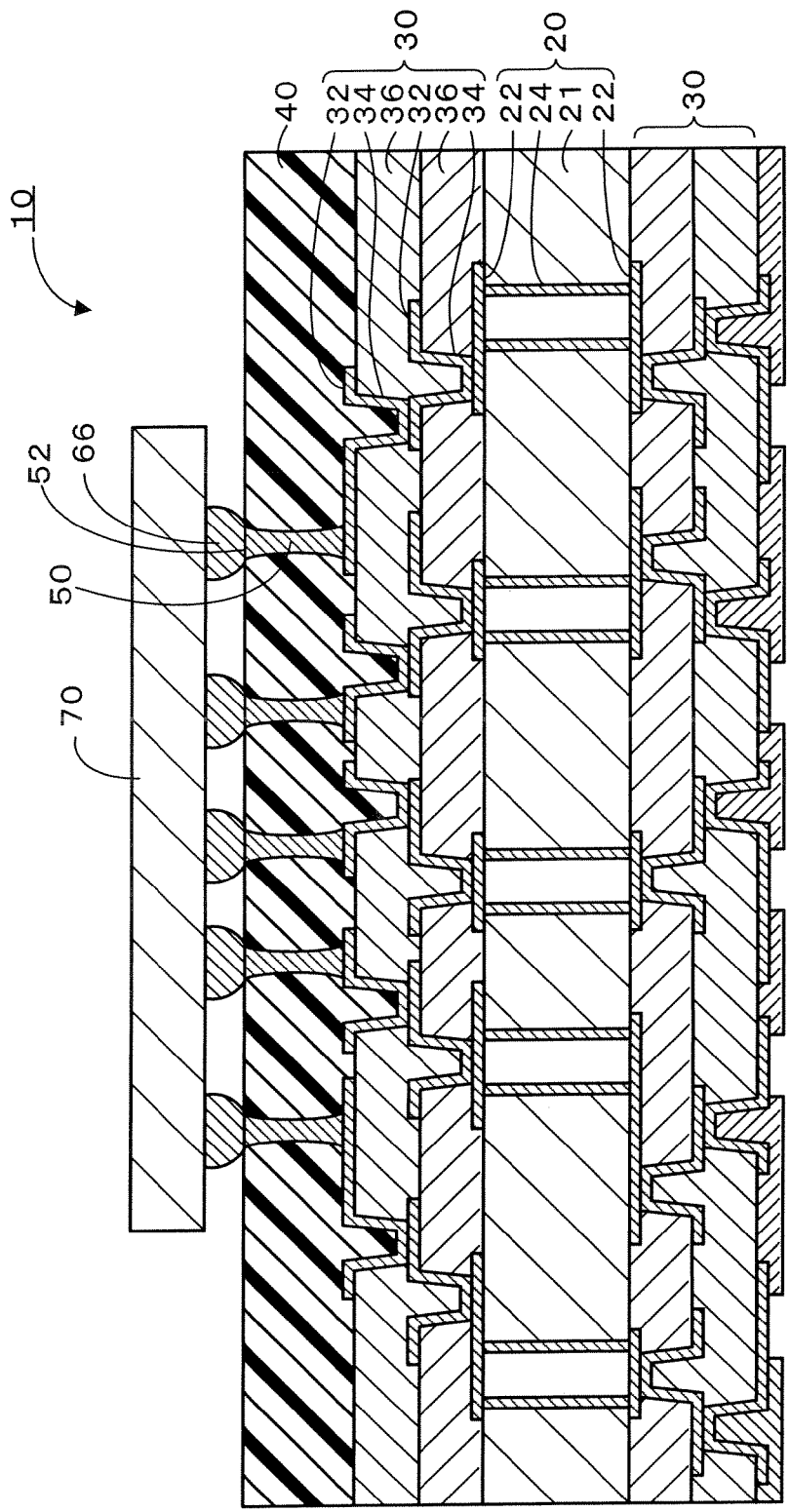
FIG. 1 is a cross-sectional view showing a multilayer printed wiring board according to an embodiment.

FIG. 1 is a cross-sectional view showing a multilayer printed wiring board according to an embodiment of the present invention. In the following description, the expressions "upper" and "lower" are used, however, these expressions merely represent the relative positional relationship for descriptive purposes. Accordingly, the expressions "upper" and "lower" may be replaced by each other or replaced by "right" and "left."

As shown in FIG. 1, a multilayer printed wiring board 10 of an embodiment is equipped with a core board 20 for electrically connecting wire patterns 22 formed on the upper and lower surfaces thereof via through-hole conductors 24, build-up layers 30 in which a plurality of conductor patterns 32 and 32 laminated via resin insulating layers 36 on the upper and lower surfaces of the core board 20 are electrically connected to each other by via holes 34, a low-elasticity layer 40 formed of low-elasticity material on the build-up layer 30, lands (mounting electrodes) 52 on which an IC chip 70 serving as an electrical part is mounted via soldering bumps 66, conductor posts 50 that penetrate through the low-elasticity layer 40 and electrically connect the lands 52 to the conductor pattern 32 formed on the upper surface of the build-up layer 30.

The core board 20 has wire patterns 22 and 22 formed of copper on both the upper and lower surfaces of a core board main body 21 formed of BT (bismaleimide-triazine) resin, glass epoxy resin or the like, and through-hole conductors 24 formed of copper on the inner circumferential surfaces of through-holes penetrating through the core board main body 21, and both the wire patterns 22 and 22 are electrically connected to each other via the through-hole conductors 24.

The build-up layers 30 are achieved on both the upper and lower surfaces of the core board 20 by alternately laminating a resin insulating layer 36 and a conductor pattern 32, and the electrical connection between the wire pattern 22 of the core board 20 and the conductor pattern 32 of the build-up layer 30 and the electrical connection between the conductor patterns 32 and 32 of the build-up layers 30 are secured by the via holes 34 penetrated in the vertical direction of the resin insulating layer 36. The above-described build-up layers 30 are formed by a well-known subtractive method or an additive method (containing a semi-additive method, a full-additive method). Specifically, each of the build-up layers 30 are formed as follows. That is, a resin sheet serving as the resin insulating layer 36 is attached to each of both the upper and lower surfaces of the core substrate 20. The resin sheet is formed of a modified epoxy resin sheet, a polyphenylene ether-based resin sheet, a polyamide-based resin sheet, a cyanoester-based resin sheet or the like. The thickness of each sheet is set to substantially 20 to 80 μm, and the Young's modulus of the sheet at the normal temperature is set to 2 to 7 GPa. Inorganic filler may be dispersed in each resin sheet. In this embodiment, thermosetting resin film produced by Ajinomoto Co., Inc. (name of product: ABF-45SH, Young's modulus: 3.0 GPa) is used. Subsequently, through-holes are formed in the attached resin sheet by a carbon dioxide laser, UV laser, YAG laser, excimer laser or the like. Subsequently, electroless copper plating is conducted, resist is formed on the electroless copper plated layer, exposed to light and developed. Thereafter, electroless copper plating is conducted on the non-formed portion of the resist, and then the resist is seaprated. The electroless copper plating at the portion where the resist existed is etched with etching liquid based on sulfuric acid—hydrogen peroxide, thereby forming the wire patterns 32. The conductor layers in the through-holes serve as the via holes 34. Thereafter, this procedure is repeated to form the build-up layers 30.

The low-elasticity layer 40 is formed of low-elasticity material achieved from resin composition of naphthalene type epoxy resin (produced by Nippon Kayaku Co., Ltd., name of product: NC-7000L) of 100 parts by weight, phenol-xylylene glycol condensed resin (produced by Mitsui Chemicals, Inc., name of product: XLC-LL) of 20 parts by weight, carboxylic acid denatured NBR (produced by JSR Corporation., Ltd., name of product: XER-91) of 90 parts by weight as cross-linked rubber particles having Tg of −50° C., and 1-cyanoethyl-2-ethyl-4-methyl imidazole of 4 parts by weight as a hardening catalyst that are solved in ethyl lactate of 300 parts by weight. This low-elasticity material is thermo setting film (210 μm in thickness), and it is achieved by coating the above resin composition on demolded PET film and then heating the resultant at 90° C. for 30 minutes. In the low-elasticity layer 40, the Young's modulus thereof at 30° C. is equal to 500 MPa, and the glass-transition temperature Tg is equal to 160° C. When the Young's modulus of the low-elasticity layer 40 is in this range, even if stress occurs between the core board 20 and the IC chip 70 electrically connected to the lands 52 via the soldering bumps 66 due to the difference in the thermal expansion coefficient therebetween, the stress could be relaxed.

The conductor posts 50 are mainly formed of copper so as to penetrate through the low-elasticity layer 40 in the vertical direction, and electrically connect the lands 52 to the conductor pattern 32 provided on the upper surface of the build-up layer 30. Each conductor post 50 is designed to have a constricted part, and specifically it is designed so that an intermediate portion thereof is smaller in diameter than the upper and lower portions thereof. In this embodiment, the diameter of the upper portion is set to 80 μm, the diameter of the lower portion is set to 80 μm, the diameter of the intermediate portion is set to 35 μm and the height of the conductor post 50 is set to 200 μm. Accordingly, the aspect ratio Rasp of the conductor post 50 is the ratio of the height of the conductor post to the diameter of the narrowest intermediate portion, and thus it is equal to 5.7. Furthermore, the ratio of the diameter of the thickest upper portion to the diameter of the narrowest intermediate portion is equal to 2.3.

The land 52 corresponds to the apex portion of each conductor post 50 exposed from the low-elasticity layer 40. The lands 52 are subjected to nickel plating and gold plating in this order, and then connected to the electrode portions of the IC chip 70 via the soldering bumps 66.

Next, an example of manufacturing the multilayer printed wiring board 10 according to this embodiment will be described. The procedure of manufacturing the core board 20 and the build-up layers 30 is well known, and thus the procedure of manufacturing the low-elasticity layer 40, the conductor posts 50 and the lands 52 will be mainly described. FIGS. 2 to 7 are diagrams showing this procedure.

Figure 2:
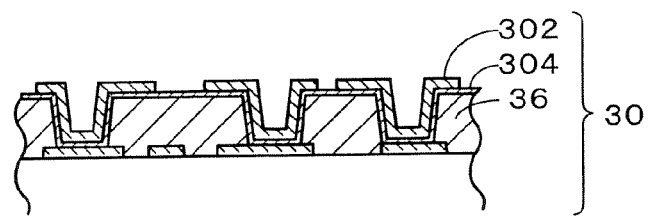
FIG. 2 is a cross-sectional view showing the multilayer printed wiring board of the embodiment being manufactured.
Figure 3:
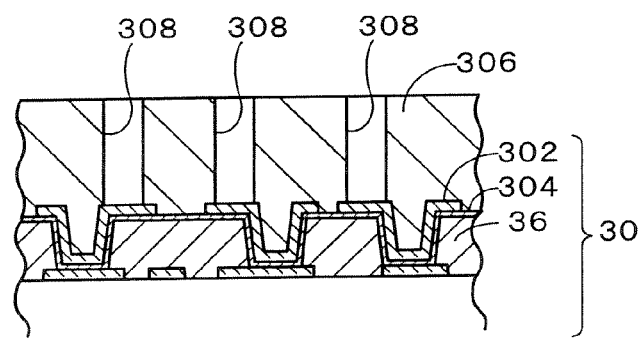
FIG. 3 is a cross-sectional view showing the multilayer printed wiring board of the embodiment being manufactured.

First, the core board 20 having the build-up layers 30 formed thereon is prepared. FIG. 2 is a partial cross-sectional view of the build-up layer 30 formed on the upper surface of the core board 20. At this stage, the surface of the uppermost resin insulating layer 36 is still coated by the electroless copper plating layer 304. That is, electroless copper plating is conducted on the resin insulating layer 36 after the through-holes are formed, photoresist is formed and patterned on the electroless copper plated layer 304, and then electrolytic copper plating is conducted on a portion at which no photoresist is formed, thereby forming the electroless copper plated layer 304 and the electrolytic copper plated layer. Thereafter, the photoresist is separated. Accordingly, the electrolytic copper plated layer of the conductor layer is patterned and becomes a patterned plated layer 302. However, the electroless copper plated layer 304 still remains. The thickness of the electroless copper plated layer 304 is equal to several μm. Dry film 306 (240 μm in thickness) achieved by adhesively attaching two commercially-available dry films (produced by Asahi Kasei Corporation CX-A240) is adhesively attached to the upper surface of the build-up layer 30, and openings 308 of φ120 μm are formed at predetermined positions in the dry film 306 by carbon dioxide gas laser (see FIG. 3).

Figure 4:
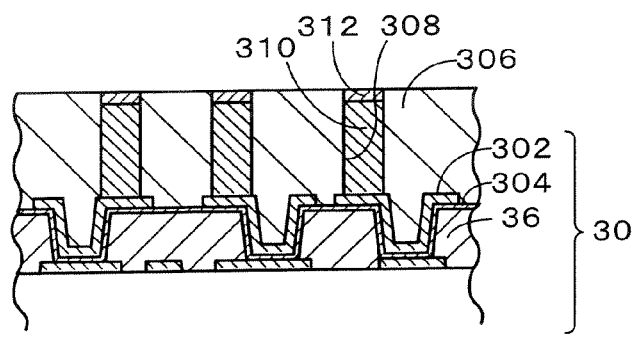
FIG. 4 is a cross-sectional view showing the multilayer printed wiring board of the embodiment being manufactured.
Figure 5:
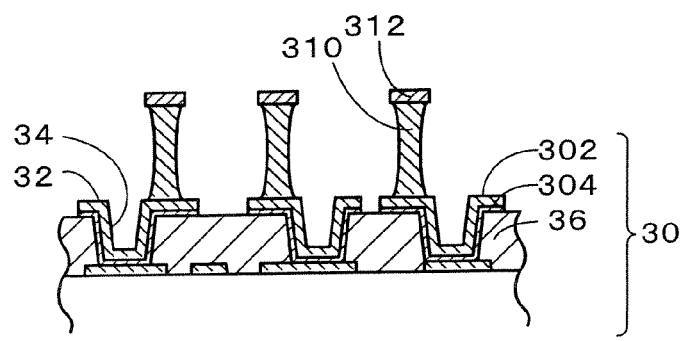
FIG. 5 is a cross-sectional view showing the multilayer printed wiring board of the embodiment being manufactured.
Figure 6:
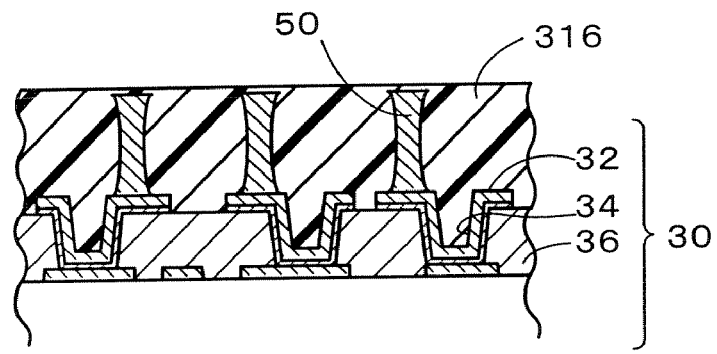
FIG. 6 is a cross-sectional view showing the multilayer printed wiring board of the embodiment being manufactured.
Figure 7:
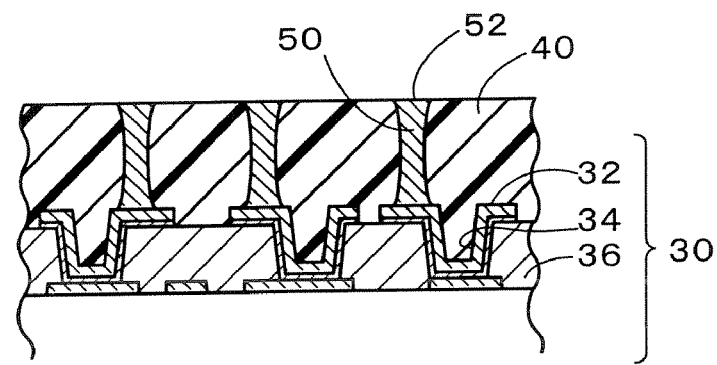
FIG. 7 is a cross-sectional view showing the multilayer printed wiring board of the embodiment being manufactured.

Subsequently, with respect to the board being manufactured, electrolytic copper plating is conducted from the bottom portions of the openings 308 to fill columnar copper layers 310 in the openings 308, and solder layers 312 are further formed on the upper surfaces of the copper layers 310 (see FIG. 4). The following composition is used as the electrolytic copper plating liquid: sulfuric acid of 2.24 mol/l, copper sulfate of 0.26 mol/l, additive of 19.5 ml/l (produced by Atoteck Japan Co., Ltd. Kaparacid GL). Furthermore, the electrolytic copper plating is conducted under the following condition that the current density is set to 1A/dm2, the time is set to 17 hours and the temperature is set to 22±2° C.

Subsequently, the dry film 306 is separated (see FIG. 5), and then the board being manufactured is immersed in ammonia alkali etching liquid (name of product: A process, produced by Meltex, Inc.) to be etched. The electroless copper plated layer 304 at the portion covered by the dry film 306, that is, at the portion not covered by electrolytic copper plated layer 302 is removed by this etching, and also the intermediate portion of each columnar copper layer 310 is corroded to have a constricted shape (see FIG. 5). As a result, the upper surface portion of the resin insulating layer 36 of the electrolytic copper plated layer 302 and the electroless copper plated layer 304 becomes the conductor pattern 32, and the through-hole portions become the via holes 34. At this time, the solder layers 312 function as etching resist. Here, the corrosion degree of the intermediate portion of the copper layer 310 can be controlled by the etching time. For example, if the etching time is set to 10 to 60 seconds, the maximum diameter of the copper layer 310 (the diameter of the upper portion or lower portion) is equal to 60 to 120 μm, and the diameter of the intermediate portion is equal to 30 to 60 μm. However, the maximum diameter and the diameter of the intermediate portion may be changed to values other than the above values by changing the diameter of the openings 308.

Subsequently, the solder layers 312 are immersed in a solder exfoliating agent (name of product: Enstrip TL-106, produced by Meltex, Inc.) and removed. Thereafter, the resin film 316 is laminated on the board being manufactured (see FIG. 6), hardened at 150° C. for 60 minutes, and then polished until the surfaces of the conductor posts 50 are exposed (see FIG. 7). The resin film 316 is equipped with resin composition of naphthalene type epoxy resin (produced by Nippon Kayaku Co., Ltd., name of product: NC-7000L) of 100 parts by weight, phenol-xylylene glycol condensed resin (produced by Mitsui Chemicals Inc., name of product: XLC-LL) of 20 parts by weight, carboxylic acid denatured NBR (produced by JSR Corporation., name of product: XER-91) of 90 parts by weight as cross-linked rubber particles having Tg of −50° C., and 1-cyanoethyl-2-ethyl-4-methyl imidazole of 4 parts by weight as a hardening catalyst that are solved in ethyl lactate of 300 parts by weight. Furthermore, the apex portions of the conductor posts 50 exposed from the low-elasticity layer 40 serve as the lands 52. Finally, the height of the conductor posts 50 is equal to 200 μm.

Figure 8:
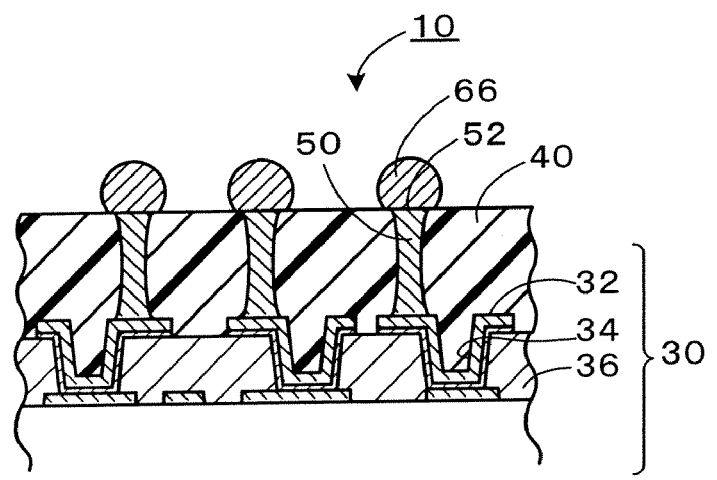
FIG. 8 is a cross-sectional view showing the multilayer printed wiring board of the embodiment being manufactured.

Subsequently, the board being manufactured is immersed in acidic solution containing a palladium catalyst for activating the surface of copper, and then immersed in electroless nickel plating liquid of pH5 containing nickel chloride of 30 g/l, sodium hypophosphite of 10 g/l and sodium acid citrate of 10 g/l for 20 minutes, thereby forming a nickel-plated layer of 5 μm in thickness on each land 52. Furthermore, the board is immersed in electroless gold plating liquid containing potassium gold cyanide of 2 g/l, ammonium chloride of 75 g/l, sodium acid citrate of 50 g/l and sodium hypophosphite of 10 g/l for 23 seconds at 93° C., and a gold plated layer of 0.03 μm in thickness is formed on the nickel plated layer. Then, soldering paste is printed by using a mask pattern and reflowed at 200° C. to form solder bumps 66 on the lands 52, thereby manufacturing the multilayer printed wiring board 10 (see FIGS. 8 and 1).

According to the multilayer printed wiring board 10 of the embodiment described above, the low-elasticity layer 40 formed of the resin composition containing epoxy resin, phenol resin, cross-linked rubber particles and hardening catalyst has a high Tg, and thus even when the temperature of the low-elasticity layer 40 is increased by the thermal treatment process when the multilayer printed wiring board 10 is manufactured or heating of the mounted IC chip 70, the temperature of the low-elasticity layer 40 does not exceed the Tg, and thus it does not excessively expand. Accordingly, the low-elasticity layer 40 can be prevented from being separated even under high temperature, and the connection reliability of the conductor posts 50 penetrating through the low-elasticity layer 40 can be secured. Furthermore, the aspect ratio Rasp of the conductor posts 50 is proper, and thus even when stress caused by the difference in the thermal expansion coefficient between the core board 20 and the IC chip 70 occurs, the stress can be reliably relaxed. Therefore, the breaking of the connection to the IC chip 70 due to the thermal expansion/thermal contraction can be prevented, and the variation rate of the electrical resistance when heating/cooling is repeated can be suppressed to low levels, so that power can be stably supplied to the IC chip 70. Furthermore, the conductor posts 50 are designed so that the diameter of the narrowest portions exceeds 30 μm, so that the voltage drop when the power is supplied to the IC chip 70 can be suppressed and thus the IC chip 70 can be prevented from malfunctioning. Particularly, this effect becomes remarkable when an IC chip 70 of 3 GHz or more is mounted. Furthermore, the conductor post 50 is designed to have a constricted part, and also the ratio of the diameter of the thickest part of the conductor post 50 to the diameter of the narrowest part of the conductor post 50 (the thickest part/the narrowest part) is equal to or more than 2. Therefore, as compared with the conductor post having substantially the straight shape, the variation rate of the electrical resistance when heating/cooling is repeated can be further suppressed. This is because the low-elasticity layer 40 and the conductor posts 50 are deformed together. These effects have been experimentally verified by experiments described later. Furthermore, the apex portions of the conductor posts 50 formed so as to be located on the same plane as the upper surface of the low-elasticity layer 40 are used as the lands 52. Therefore, as compared with a case where lands are formed separately from the conductor posts 50, the lands can be manufactured more simply. Furthermore, the Young's modulus of the low-elasticity layer 40 is equal to 10 MPa to 1 GPa at 30° C., and thus the stress caused by the difference in thermal expansion coefficient can be further reliably relaxed.

The present invention is not limited to the above embodiment, and various modifications may be made without departing from the technical scope of the present invention.

In the above-described embodiment, each conductor post 50 is designed to have a constricted part. The conductor post may be designed to have a substantially straight columnar shape. When the conductor post 50 is designed to have a substantially straight columnar shape as described above, etching maybe conducted by linearly spraying etching liquid from a slit nozzle or the like. In this case, when the aspect ratio Rasp of the conductor post 50 is not less than 4 and less than 20, the breaking of the connection to the IC chip 70 due to thermal expansion/thermal contraction can be prevented and also the malfunction of the IC chip 70 can be prevented as in the case of the above-described embodiment. At this time, it is preferable that the diameter of the cross section of the conductor post 50 exceeds 30 μm to suppress the voltage drop amount to low levels. However, when the diameter exceeds 80 μm, the deformation of the low-elasticity layer 40 may be obstructed by the conductor posts 50, and it is preferable that the diameter of the cross section of the conductor post 50 ranges from more than 30 μm to not more than 80 μm. These preferable conditions have been verified by the experiments described later.

Furthermore, a solder resist layer may be formed on the low-elasticity layer 40 of the above-described embodiment. In this case, openings are formed in the solder resist layer so that the lands 52 are exposed to the outside. The solder resist layer may be formed in the usual manner.

In the above-described embodiment, only one layer of the low-elasticity layer 40 having the conductor posts 50 is formed on the build-up layer 30. A plurality of low-elasticity layers 40 may be laminated.

In the above-described embodiment, the land 52 is formed as the apex portion of the conductor post 50, that is, a part of the conductor post 50. The land 52 may be otherwise provided separately from the conductor post 50.

EXAMPLES

Examples to verify the effect of the multilayer printed wiring board 10 of the above-described embodiment will be described. First, the relationship between the aspect ratio Rasp of the conductor post and the variation rate of the electrical resistance when heating/cooling is repeated will be described. In this case, the multilayer printed wiring board having the conductor posts of the first to twelve examples shown in the table of FIG. 9 were prepared according to the above-described embodiment. Specifically, in each example, the hole diameter of the opening 308 formed in the dry film 306 (240 μm in thickness) of FIG. 3 by using a carbon dioxide gas laser was set in conformity with the maximum diameter of the conductor post, and the etching time of the copper layer 310 of FIG. 5 was set in conformity with the minimum diameter of the conductor post. When the minimum diameter is equal to the maximum diameter, the conductor post is a substantially straight columnar post. When the minimum diameter is different from the maximum diameter, the conductor post is a conductor post having a constricted part. Furthermore, in the case of the straightly-shaped conductor posts, spray etching using a slit nozzle was adopted. An IC chip was mounted on the thus manufactured multilayer printed wiring board of each example, and then sealing resin was filled between the IC chip and the multilayer printed wiring board to form an IC-mounted board. Then, the electrical resistance of a specific circuit via the IC chip (the electrical resistance between a pair of electrodes that are exposed to the surface opposite the IC-chip mounted surface of the IC-mounted board and conducted to the IC chip) was measured, and the measured value was set as an initial value. Thereafter, a heat cycle test was conducted on the IC-mounted board. In the heat cycle test, one cycle was set to have a condition: −55° C.×5 minutes and 125° C.×5 minutes, and this cycle was repeated 1500 times (cycles). In the heat cycle test, the electrical resistance was measured at the 500-th cycle, 750-th cycle, 1000-th cycle and 1500-th cycle, and the variation rate from the initial value (100×(measured value−initial value)/initial value (%)) was calculated. The calculation result is shown in the table of FIG. 9. In this table, when the variation rate of the electrical resistance is within ±5%, it is regarded as "excellent" (○, circle), when the variation rate is within ±5 to 10%, it is regarded as "normal" (Δ, triangle), and when the variation rate exceeds ±10%, it is regarded as "defective" (x, cross). A target specification was set so that the variation rate at the 1000-th cycle was within ±10% (that is, estimated as "normal" or "excellent"). As is apparent from this table, when the aspect ratio Rasp was equal to or more than 4, the estimation was "excellent" until at least the 1000-th cycle, however, when the aspect ratio Rasp was equal to or less than 3.3, the estimation was almost "defective." Furthermore, when the aspect ratio Rasp was equal to 20, cracks occur in the conductor posts, and breaking of wires occurred. Furthermore, in the case of the same aspect ratio Rasp, the conductor posts having the constricted parts were superior to the conductor posts having substantially the straight shape.

Figure 10:
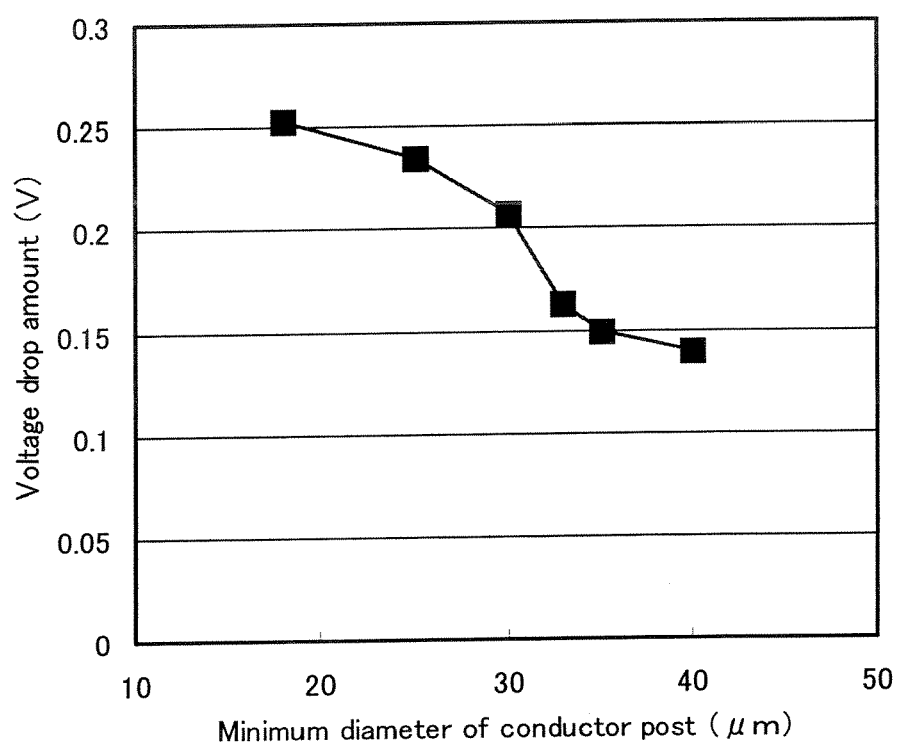
FIG. 10 is a table and graph showing the relationship between the minimum diameter of the conductor post and a voltage drop amount.

Next, the relationship between the minimum diameter of the conductor post and the voltage drop will be described. In this case, the multilayer printed wiring boards of the examples 13 to 18 shown in a table of FIG. 10 were manufactured according to the above-described embodiment. Specifically, in each example, the hole diameter of the opening 308 formed in the dry film 306 (240 μm) of FIG. 3 by a carbon dioxide gas laser was set in conformity with the maximum diameter of the conductor posts, and the etching time of the copper layer 310 of FIG. 5 was set in conformity with the minimum diameter of the conductor posts. An IC chip driven at high speed (3.1 GHz) was mounted on the thus manufactured multilayer printed wiring board of each example, and a voltage drop amount when a fixed amount of power was supplied to the IC chip to actuate the IC chip was measured. The voltage of the IC chip cannot be directly measured. Therefore, a circuit that can measure the voltage of the IC chip was formed in the multilayer printed wiring board, and the voltage drop amount was measured by the circuit. The measurement result is shown by a table and a graph of FIG. 10. When the transistor of the IC chip is turned on, the voltage of the transistor drops at a plurality of times with time lapse. In this case, the first voltage drop amount was measured. The voltage drop amount in the table of FIG. 10 was set to the average value of voltage drop amounts when the IC chip was actuated at five times with the power source voltage set to 1.0V. On the other hand, with respect to the minimum diameter of the conductor posts in the table of FIG. 10, it was measured after the cross section was polished. With respect to the presence or absence of the malfunction of the IC chip, the simultaneous switching was repeated at one hundred times, and it was checked whether the IC chip malfunctioned during this period. As is apparent from the graph of FIG. 10, the voltage drop amount is remarkably small around the stage where the minimum diameter of the conductor post exceeds 30 μm. An IC chip of 1 GHz was mounted on the multilayer printed wiring board of the example 13 (see the table of FIG. 10) and it was likewise checked whether the IC chip malfunctioned or not. However, no malfunction occurred. When the minimum diameter of the conductor post exceeds 80 μm, it is necessary to set the aspect ratio Rasp to 4 or more, so that the conductor posts become high and thus the wiring length becomes long. Therefore, it is preferable that the minimum diameter is more than 30 μm and is not more than 80 μm.

Figure 11:
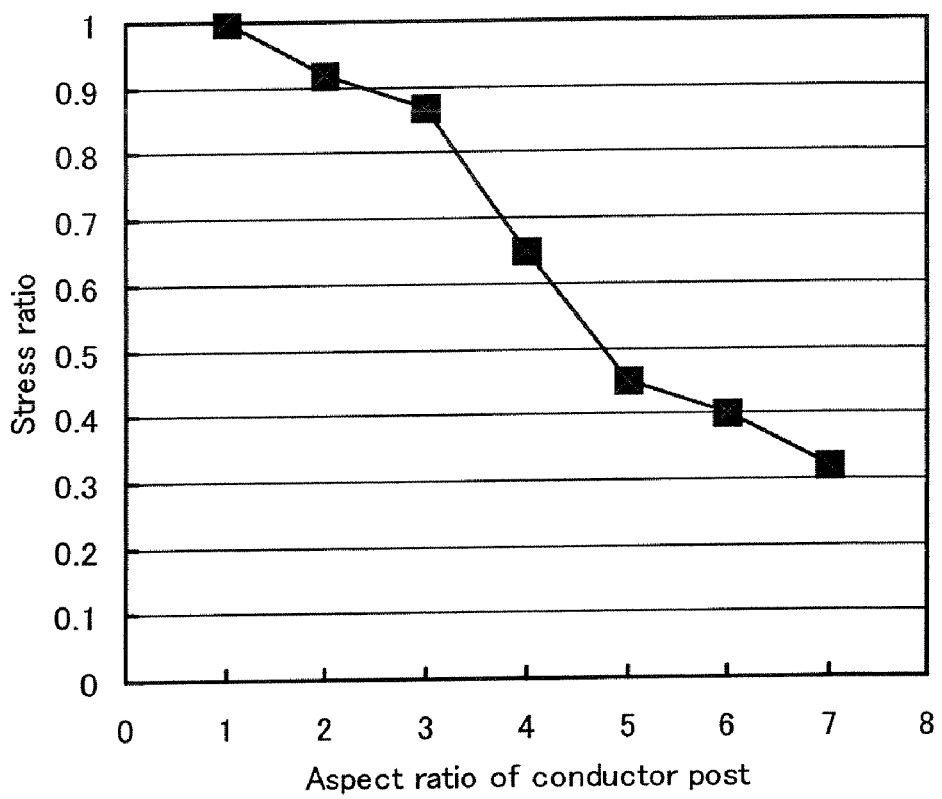
FIG. 11 is a table and graph showing the relationship between the aspect ratio of the conductor post and the stress ratio.
Figure 12:
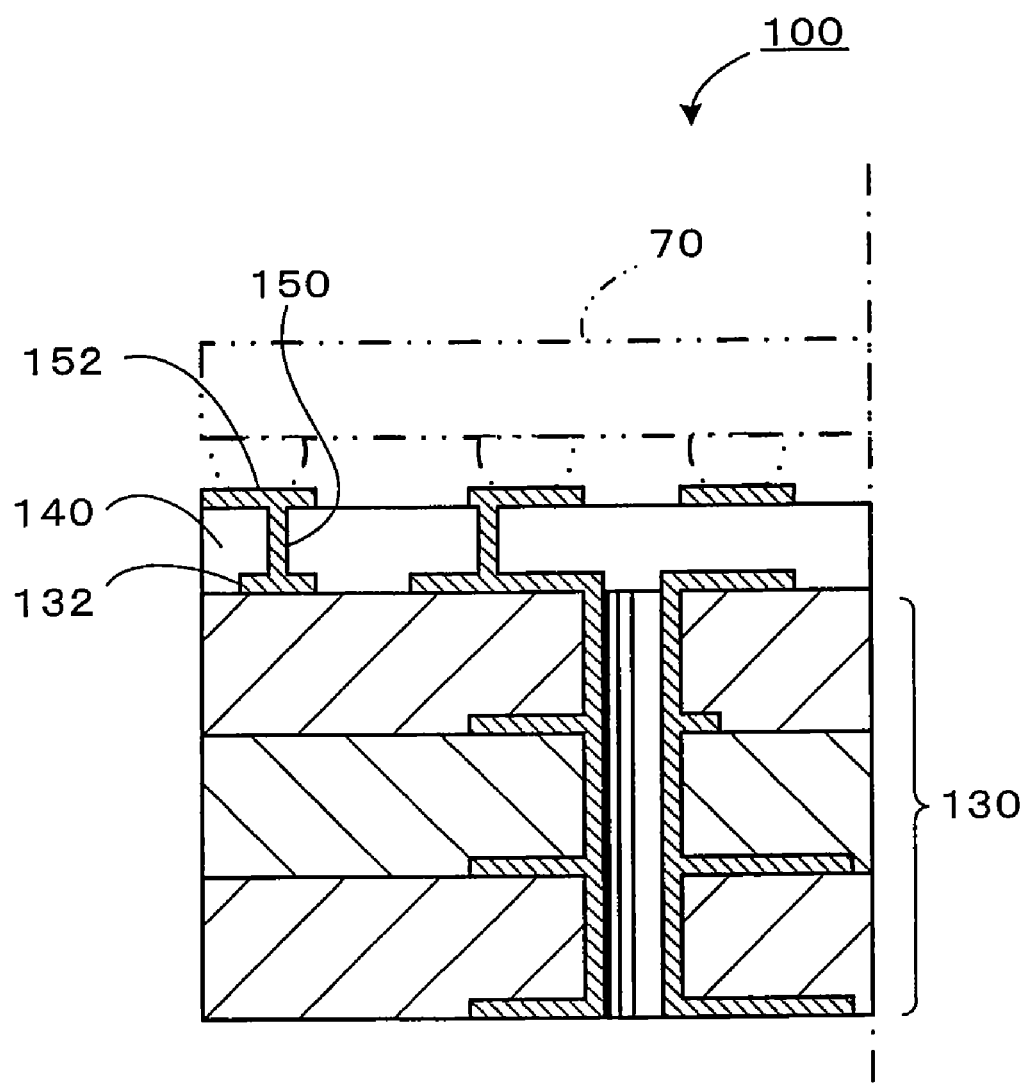
FIG. 12 is a cross-sectional view showing a conventional multilayer printed wiring board.

Next, the relationship between the aspect ratio of the conductor post and the stress applied to the insulating layer of the IC chip will be described. 3D strip simulation was carried out while varying the aspect ratio Rasp under the state that the thermal expansion coefficients, elasticity coefficients and Poisson's ratios of the various kinds of constituent materials of the IC chip, the low-elasticity layer, the solder bumps, the conductor posts, the core board, etc., are fixed, and the ratio of the stress applied to the insulating layer of the IC chip for each of the conductor posts having various aspect ratios Rasp to the stress applied to the insulating layer of the IC chip when the aspect ratio Rasp of the conductor post was equal to 1 (merely, referred to as "stress ratio") was calculated. The calculation result is shown in the table and graph of FIG. 11. As is apparent from the table and graph, it is found that the stress ratio is significantly varied at the boundary of the aspect ratio Rasp of 4. That is, when the aspect ratio Rasp is not less than 4, the stress ratio is small. On the other hand, when the aspect ratio Rasp is less than 4, the stress ratio is large.

Next, the resin composition used when the low-elasticity layer is formed will be described. As the material for forming the low-elasticity layer, the above-described low-elasticity material achieved from resin composition of naphthalene type epoxy resin (produced by Nippon Kayaku Co., Ltd., name of product: NC-7000L) of 100 parts by weight, phenol-xylylene glycol condensed resin (produced by Mitsui Chemicals Inc., name of product: XLC-LL) of 20 parts by weight carboxylic acid denatured NBR the Tg as cross-linked rubber particles of which is at −50° C. (produced by JSR Corporation., name of product: XER-91) of 90 parts by weight, and 1-cyanoethyl-2-ethyl-4-methyl imidazole of 4 parts by weight as a hardening catalyst that were solved in ethyl lactate of 300 parts by weight was used. Furthermore, the multilayer printed wiring board shown in FIG. 1 was made as an embodiment 1 by using the above low-elasticity material according to the above-described embodiment. Furthermore, the multilayer printed wiring board of FIG. 1 was made as a comparative example 1 by using olefin type resin film as the material for forming the low-elasticity layer (produced by Tomoegawa Paper Co., Ltd., part number: TLF-YM2) according to the above-described embodiment. For the embodiment 1 and the comparative example 1, oil dip (one cycle is set to keep the multilayer printed wiring board left at room temperature for 30 seconds and then left at 260° C. for 10 seconds, and 100 cycles are repeated) was conducted, and the variation rate of the electrical resistance was calculated in the same manner as described above. As a result, in the embodiment 1, the variation rate of the electrical resistance was within ±10%, however, in the comparative example, the conductor post was broken.

Further examples will be described hereunder. First, the relationship between the aspect ratio Rasp of the conductor post and the variation rate of the electrical resistance after heating/cooling is repeated will be described. Here, the multilayer printed wiring board having the conductor posts of the examples 19 to 73 shown in a table of FIG. 13 were prepared according to the above-described embodiment. Specifically, in each example, the hole diameter of the opening 308 formed in the dry film 306 by a carbon dioxide gas laser, the thickness of the dry film 306 being variously varied in accordance with the height of the conductor posts (see FIG. 3, for example, the thickness may be adjusted by changing the number of films), was set in conformity with the maximum diameter of the conductor post, and the etching time of the copper layer 310 of FIG. 5 was set in conformity with the minimum diameter of the conductor post. When the maximum diameter and the minimum diameter are equal to each other, the conductor post is a substantially straight columnar conductor post. When the minimum diameter and the maximum diameter are different from each other, the conductor post is a conductor post having a constricted part. In the case of the conductor post having the straight shape, spray etching using a slit nozzle was adopted. An IC chip was mounted on the thus manufactured multilayer printed wiring board of each example, and then sealing resin was filled between the IC chip and the multilayer printed wiring board to complete the IC-mounted board. The same heat cycle test as described above with respect to the examples 1 to 18 was conducted. However, the electrical resistance was measured and estimated for the 1750-th cycle, 2000-th cycle and 2500-th cycle. The results are shown in the table of FIG. 13. In this table, symbols ○, Δ and x have the same meaning as shown in FIG. 9.

From the results of FIG. 13, when the aspect ratio Rasp is not less than 4 and also is less than 20, the estimation was "noraml" (Δ) or "excellent" (○) until at least the 1000-th cycle. On the other hand, when the aspect ratio Rasp is less than 4 or not less than 20, the estimation was "defective" (x) at the 1000-th cycle. The reason would be estimated as follows. when the aspect ratio Rasp is less than 4 the conductor post itself interrupts the deformation of the low-elasticity layer. when the aspect ratio Rasp is not less than 20, the conductor post is excessively deformed and fatigue degradation occurs. Furthermore, when the aspect ratio Rasp was not less than 4 and not more than 6.5, excellent results were achieved at longer cycles. When the shape of the conductor post is compared in the range of the aspect ratio Rasp from not less than 4 to less than 20, the estimation for the conductor post having the constricted part (constricted shape) was "normal" or "excellent" until at least the 1500-th cycle. On the other hand, the estimation for the conductor post having the straight shape was "normal" or "excellent" until at least the 1000-th cycle, however, "defective" or "normal" at the 1500-th cycle. This is because the conductor post having the constricted part is estimated to be easily deformed together with the low-elasticity layer with the constricted part at the center of the deformation. On the other hand, with respect to the minimum diameter of the conductor post, favorable results were achieved when the minimum diameter exceeded 30 μm and was not more than 60 μm. The reason for this is estimated as follows. When the minimum diameter is not more than 30 μm, the diameter is too small and thus repetitive deformation causes fatigue degradation. On the other hand, when the minimum diameter exceeds 60 μm, the conductor post is hardly deformed. Furthermore, comparing examples 22 to 24, 35 to 37 in which the ratio of the maximum diameter/the minimum diameter of the conductor post is equal to or more than 2 and examples 25 to 27, and 38 to 40 in which the ratio of the maximum diameter/the minimum diameter of the conductor post is less than 2, the former has higher long-term reliability. The reason for this is estimated as follows. The ratio of the maximum diameter/the minimum diameter is large, and thus the conductor post is liable to be suitably deformable.

The same conductor posts as the example 22 were manufactured using the resin insulating layer (produced by Ajinomoto Co., Inc., name of product:ABF-45SH, Young's modulus: 3.0 GPa) used to form the build-up layer instead of that used to form the low-elasticity layer, and the same estimation test as the above-described respective examples was conducted. In this case, the estimation was already "defective" (x) at the 500-th cycle. The reason for this was estimated as follows. The resin insulating layer having a high elasticity coefficient was adopted in place of the low-elasticity layer, and thus the stress could not be relaxed.

Examples 74 to 83 were manufactured by changing the blend amount of the resin composition of the low-elasticity layer 40 in the examples 21 to 30. Specifically, a resin composition containing naphthalene type epoxy resin of 100 parts by weight, phenol-xylylene glycol condensed resin of 10 parts by weight, carboxylic acid denatured NBR of 7 parts by weight as cross-linked rubber particles having a Tg of −50° C., and 1-cyanoethyl-2-ethyl-4-methyl imidazole of 0.5 parts by weight as a hardening catalyst that were solved in ethyl lactate of 300 parts by weight was used. The glass transition temperature Tg of the resin composition was equal to 165° C.

Examples 84 to 93 were manufactured by changing the blend amount of the resin composition of the low-elasticity layer 40 in the examples 21 to 30. Specifically, a resin composition containing naphthalene type epoxy resin of parts by weight, phenol-xylylene glycol condensed resin of 5 parts by weight, carboxylic acid denatured NBR of 180 parts by weight as cross-linked rubber particles having a Tg of −50° C., and 1-cyanoethyl-2-ethyl-4-methyl imidazole of 10 parts by weight as a hardening catalyst that were solved in ethyl lactate of 300 parts by weight was used. The glass transition temperature Tg of the resin composition was equal to 125° C.

Examples 94 to 103 were manufactured by changing the blend amount of the resin composition of the low-elasticity layer 40 in the examples 21 to 30. Specifically, a resin composition containing naphthalene type epoxy resin of 100 parts by weight, phenol-xylylene glycol condensed resin of 5 parts by weight, carboxylic acid denatured NBR of 5 parts by weight as cross-linked rubber particles having a Tg of −50° C., and 1-cyanoethyl-2-ethyl-4-methyl imidazole of 0.1 parts by weight as a hardening catalyst that were solved in ethyl lactate of 300 parts by weight was used. The glass transition temperature Tg of the resin composition was equal to 140° C.

Examples 104 to 113 were manufactured by changing the blend amount of the resin composition of the low-elasticity layer 40 in the examples 21 to 30. Specifically, a resin composition containing naphthalene type epoxy resin of 100 parts by weight, phenol-xylylene glycol condensed resin of 100 parts by weight, carboxylic acid denatured NBR of 200 parts by weight as cross-linked rubber particles having a Tg of −50° C., and 1-cyanoethyl-2-ethyl-4-methyl imidazole of 20 parts by weight as a hardening catalyst that were solved in ethyl lactate of 300 parts by weight was used. The glass transition temperature Tg of the resin composition was equal to 155° C.

Naphthalene type epoxy resin, phenol-xylylene glycol condensed resin and carboxylic acid denatured NBR used in the examples 74 to 113 are commercially available as in the case of the example 1. Also with respect to the examples 74 to 113, the same heat cycle test as the examples 1 to 18 was conducted. The results are shown in the table of FIG. 14. In the table, the symbols ○, Δ and X have the same meaning as shown in FIG. 9. As is apparent from this table, when the condition: the aspect ratio is equal to 4.0, the ratio of the maximum diameter/the minimum diameter is equal to or more than 2.0 and the minimum diameter of the conductor post exceeds 30 μm and is not more than 60 μm was satisfied (examples 75 to 77, 85 to 87, 95 to 97, 105 to 107), excellent results were particularly achieved. Furthermore, comparing the examples in which the conductor posts had the same shape (that is, the examples having the same trailing number like the examples 74, 84, 94, 104, etc.) in the examples 74 to 113, the examples 74 to 83 and 84 to 93 had further excellent results than the examples 94 to 103, 104 to 113.

The present invention claims the benefit of priority from the Japanese Patent Application No. 2004-157459 filed on May 27, 2004; the entire contents of which are incorporated herein by reference.

The invention claimed is:

1. A multilayer printed wiring board comprising:
a core board;
a build-up layer that is formed on the core board and has a conductor pattern formed on the upper surface thereof;
a resin layer comprising a hardened film formed on the build-up layer and formed by hardening a resin composition comprising an epoxy resin, a phenol resin, cross-linked rubber particles and a hardening catalyst;
a mounting electrode for mounting an electrical part provided on the upper surface of the resin layer; and
a conductor post penetrating through the resin layer for electrically connecting the mounting electrode to the conductor pattern,
wherein the resin composition comprises 5 to 100 parts by weight of the phenol resin, 5 to 200 parts by weight of the cross-linked rubber particles and 0.1 to 20 parts by weight of the hardening catalyst with respect to 100 parts by weight of the epoxy resin, the cross-linked rubber particles have a glass-transition temperature in a range between −80° C. to −20° C., and the resin composition has a glass-transition temperature in a range between 100° C. to 200° C.

2. The multilayer printed wiring board according to claim 1, wherein the resin composition contains phenol resin of 10 to 50 parts by weight, cross-linked rubber particles of 7 to 180 parts by weight and a hardening catalyst of 0.5 to 10 parts by weight with respect to epoxy resin of 100 parts by weight.

3. The multilayer printed wiring board according to claim 1, wherein the conductor post has the aspect ratio Rasp of not less than 4 and less than 20.

4. The multilayer printed wiring board according to claim 1, wherein the conductor post has the diameter of 30 μm or more.

5. The multilayer printed wiring board according to claim 1, wherein the conductor post is designed to have a constricted shape.

6. The multilayer printed wiring board according to claim 5, the ratio of the diameter of the thickest part of the conductor post to the diameter of the narrowest part of the conductor post is 2 or more.

7. The multilayer printed wiring board according to claim 5, wherein the minimum diameter of the conductor post is more than 30 μm and not more than 60 μm.

8. The multilayer printed wiring board according to claim 1, wherein the mounting electrode is the apex portion of the conductor post that is formed on the substantially same plane as the upper surface of the resin layer.

9. The multilayer printed wiring board according to claim 1, wherein the resin layer has a Young's modulus of 10 MPa to 1 GPa at 30° C.

* * * * *